United States Patent [19]
Collins et al.

[11] Patent Number: 5,868,261
[45] Date of Patent: Feb. 9, 1999

[54] ANTI-SLAMMING LATCH APPARATUS FOR MODULAR COMPONENT INSTALLATIONS

[75] Inventors: Pat E. Collins, Colorado Springs; Grant E. Carlson, Woodland Park; Karl H. Cunha, Colorado Springs, all of Colo.

[73] Assignee: Digital Equipment Corporation, Maynard, Mass.

[21] Appl. No.: 749,466

[22] Filed: Nov. 15, 1996

[51] Int. Cl.$^6$ ..................................................... A47F 7/00
[52] U.S. Cl. .............................................................. 211/26
[58] Field of Search ................................ 211/26, 89.01; 361/685; 312/223.1

[56] References Cited

U.S. PATENT DOCUMENTS

| | | | |
|---|---|---|---|
| 3,547,274 | 12/1970 | Sosinkski ................................ | 211/26 X |
| 3,559,813 | 2/1971 | Soskinski ................................ | 211/26 X |
| 4,845,591 | 7/1989 | Pavie ........................................ | 211/26 X |
| 5,247,427 | 9/1993 | Driscoll et al. ............................ | 211/26 |

*Primary Examiner*—Alvin Chin-Shue
*Assistant Examiner*—Sarah Purol

[57] ABSTRACT

An anti-slamming latch is described for removably installing a module housing into a bay in a frame having a predetermined width. The module housing has a guide pin on a front portion thereof projecting from said housing. The latch apparatus comprises a latch body supported from the frame allowing straightforward removal and insertion of a rear portion of the module housing into said bay. The latch body has a first channel therein adapted to receive and engage the guide pin when the body is in a first position. This channel has a closed end engaging the pin to prevent insertion of said module housing past a predetermined intermediate position in the bay. The latch body has a second channel intersecting the first channel forming a rounded protuberance therebetween.

The module may not be further inserted by pushing on the module. It may only be fully inserted in the bay by moving the latch body from the first position to dislodge the pin from the closed end of the first channel, move the pin over the rounded protuberance, and into the second channel in the body. Movement of the latch body levers the pin along the second channel, and thus the module into full insertion, to a second closed position wherein the pin is fully within in the second channel in the latch body.

34 Claims, 4 Drawing Sheets

5,868,261

ANTI-SLAMMING LATCH APPARATUS FOR MODULAR COMPONENT INSTALLATIONS

CROSS REFERENCE TO RELATED APPLICATIONS

This application is related to the following commonly owned applications: Attorney Docket Nos. PD96-0201, entitled "Attenuating Vibrations In A Mounting Shelf for Multiple Disk Drives"; PD96-25504, entitled "High Frequency EMI Shield With Air Flow For Electronic Device Enclosure"; and PD25571 entitled "Tab and Slot Disk Drive Vibration Reduction Structure", all filed on this same date.

BACKGROUND OF THE INVENTION

1. Field of the Invention

This invention generally relates to rack mounted modular components such as shelf or box mounted electronics and computer components and more particularly to a latching apparatus for positive insertion and latching of modular housings in a rack mounted enclosure.

2. Description of the Related Art

Conventional computer hard disk drives adapted for use in mainframe and large server applications such as commercial installations are currently packaged in electronic component modules, such as hard disk drive modules, which are installed side by side in a five sided enclosure or shelf unit which is in turn mounted in a vertical rack of similar shelves. These hard disk drive modules are typically conventional 3½ inch form factor high performance drives each enclosed by a module housing about 3¾ inch by 2 inches by 6½ inches. In order to positively secure these modules in the shelf which has the required number of electrical peripheral connectors on its internal back plane, these module housings typically have some kind of latch on the front which engages a corresponding recess in the shelf to ensure the module is fully inserted and to keep the module from popping out of its back plane socket.

A major disadvantage with conventional latch designs being used is that a large amount of finger force is required to either latch or unlatch the module from the shelf. In addition, the module latches are difficult to grasp. Therefore the individual who frequently need to remove and install these modules often simply starts to insert the module in the slot or space available and then slams the module into the shelf, sometimes repeatedly, in order to make solid connection with the latch and the connector on the back plane without having to separately exert force on the module housing to latch the module housing in place.

A direct consequence of this slamming into the back plane connector is that unacceptable and damaging capacitive in rush or startup currents may be generated during the power-up of the module. Typically, these modules may be "hot-plugged" into the back plane. In other words, a cold, i.e. unenergized, module is connected into a connector already having its 5 volt power pins energized. The pins on these connectors are designed so that power and ground are applied before the output and signal connections are made. This is accomplished by making these pins longer so that they are engaged with their mating sockets before the output and signal connection pins and sockets are mated. This difference in length prevents in rush or surge currents from damaging module subcomponents when a module is inserted by hand with normal force and speed. Also, a resistance is provided in series with these power pins to minimize the effect of in rush current which does occur when they are hot plugged. These two features cooperate to prevent undesirable currents from being generated during power-up under normal operating conditions.

However, when the individual slams a module into a bay slot and into connection with the connector on the back plane, there is only about a millisecond or less between mating of the power pins and sockets and the mating of the output and signal pins and sockets. Consequently there is insufficient time for the power supply voltage to be fully developed, i.e. rise to a constant level, within the module before signal pin mating, and abnormal in rush currents are generated which can damage internal components, generate false signals to other peripheral devices or to the computer, and/or destroy stored digital information.

Another problem with conventional module latching mechanisms is that they are usually located on the front end face of the module housing. Accordingly, these latching mechanisms cannot be used on modules with removable media, or modules which contain other peripheral devices such as tape drives, CD-ROM drives, PCMCIA card carriers, etc., all of which require access through the end face in order to insert or remove the removable internal components.

Therefore there is a need for an apparatus which prevents the buildup and transfer of harmful startup currents during hot installation and/or removal of modular components. There is also a need for an apparatus which assists the operator with insertion so that there is no need or desire to slam the module into the shelf. There is also a need for a latching apparatus which can positively lock the module in place to prevent unauthorized removal and inadvertent removal of the module.

SUMMARY OF THE INVENTION

The latching apparatus in accordance with the present invention solves the above identified problems and meets the needs just discussed. It is therefore an object of the present invention to provide an improved latching apparatus for securing a component module within a bay of a rack shelf that prevents slamming of the module into the connector mounted on the back plane of the shelf.

It is another object of the invention to provide an in improved latching apparatus that assists the operator in fully inserting the module connector into the mating back plane connector as the latching apparatus is fully operated.

It is another object of the invention to provide an improved latching apparatus that is economical to manufacture and simple to use.

It is another object of the invention to provide an improved latching apparatus that may be used with modules having removable subcomponents through the front face of the module housing.

It is another object of the invention to provide a key lockable latching apparatus for modular installations to prevent unauthorized removal of modules from an installed configuration.

It is a still further object of the invention to provide an ergonomically improved latching apparatus for a rack mounted module.

The latching apparatus in accordance with the present invention is designed to first prevent slamming of a module being inserted into a shelf bay into contact with an electrical connector on the shelf back plane. Secondly, the latch assists the operator in fully inserting the module in the bay and into mating contact with the connector on the back plane. Third, the latch apparatus prevents inadvertent removal of the module from the bay. Fourth, the latch includes a locking feature to prevent unauthorized removal of a module from the bay. Fifth, the latch apparatus mechanically assists the operator in disconnecting the module from the back plane connector during removal of the module.

The latch apparatus includes a latch member, a strike recess or notch in the frame of the shelf which is engaged by a portion of the latch member, and a stop pin on the module which engages the latch member to prevent slamming of the module into the shelf bay. The latch apparatus comprises a latch body supported from the frame allowing straightforward removal and insertion of a rear portion of the module housing into said bay. The latch body has a first channel therein adapted to receive and engage the guide pin when the latch body is in a first, or open position. In this position, the first channel is parallel to the direction of module insertion. This channel has a closed end engaging the pin to prevent insertion of the module housing past a predetermined intermediate position in the bay.

The module may not be further inserted by pushing on the module. It may only be fully inserted in the bay by moving the latch body from the first position to dislodge the pin from the closed end of the first channel, move the pin over a rounded protuberance, and into a second channel in the body which intersects the first channel. Movement of the latch body levers the pin along the second channel, and thus guides the module into full insertion, to a second closed position wherein the pin is fully within in the second channel in the latch body. In this second, closed position, the second channel is substantially aligned at about a right angle to the direction of insertion of the module into the bay.

As the module is levered fully into the bay so that the mating connectors on the rear of the module are engaged, an integral latch arm on the latch body engages a recess in the frame to retain the module housing in the bay. This latch arm has a large catch tooth which engages the recess in the frame and also has plurality of smaller latch teeth which ratchet along a plurality of complementary teeth on the frame after the catch tooth is engaged. These latch teeth snug the module housing, and thus the rear connector on the module, into full engagement with the mating back plane connector, and compensates for cumulative manufacturing dimensional tolerances. In addition these teeth engage to press the rear edges of the module housing into a resilient conductive pad on the back plane to ensure complete EMI shielding of the module. The small teeth thus provide an adjustable feature to the latch apparatus.

The module could conceivably be forceably yanked out of the bay if only the small teeth held the module in place in the bay. However, this cannot happen, because the large catch tooth must be disengaged to remove the module from the bay. Thus the large tooth acts as a backup latch to ensure that the module may not be inadvertently removed from the bay. In addition, this guard tooth provides a substantial tactile feedback to the operator when it snaps into engagement in the shelf bay to positively indicate that the module is latched in place.

The latch apparatus also includes a keyed barrel lock on the front of the latch body that prevents unauthorized tampering/removal of a module housing from the shelf in which it is installed. The lock is a rotatable cylinder or barrel set within a complementary bore in the latch body opposite the latch arm. A projection on the latch arm fits within a corresponding recess in the cylinder when the latch is in the unlocked position, permitting the latch arm to deflect to allow the catch tooth to disengage the recess in the frame. When the lock cylinder is turned so that the lock recess is not aligned with the latch projection, the latch arm cannot be deflected, and the latch is locked.

These and other objects, features, and advantages of the latch apparatus in accordance with the present invention will become more apparent from the following Detailed Description when taken in conjunction with the appended drawing figures.

DETAILED DESCRIPTION OF THE INVENTION

Figure 1:
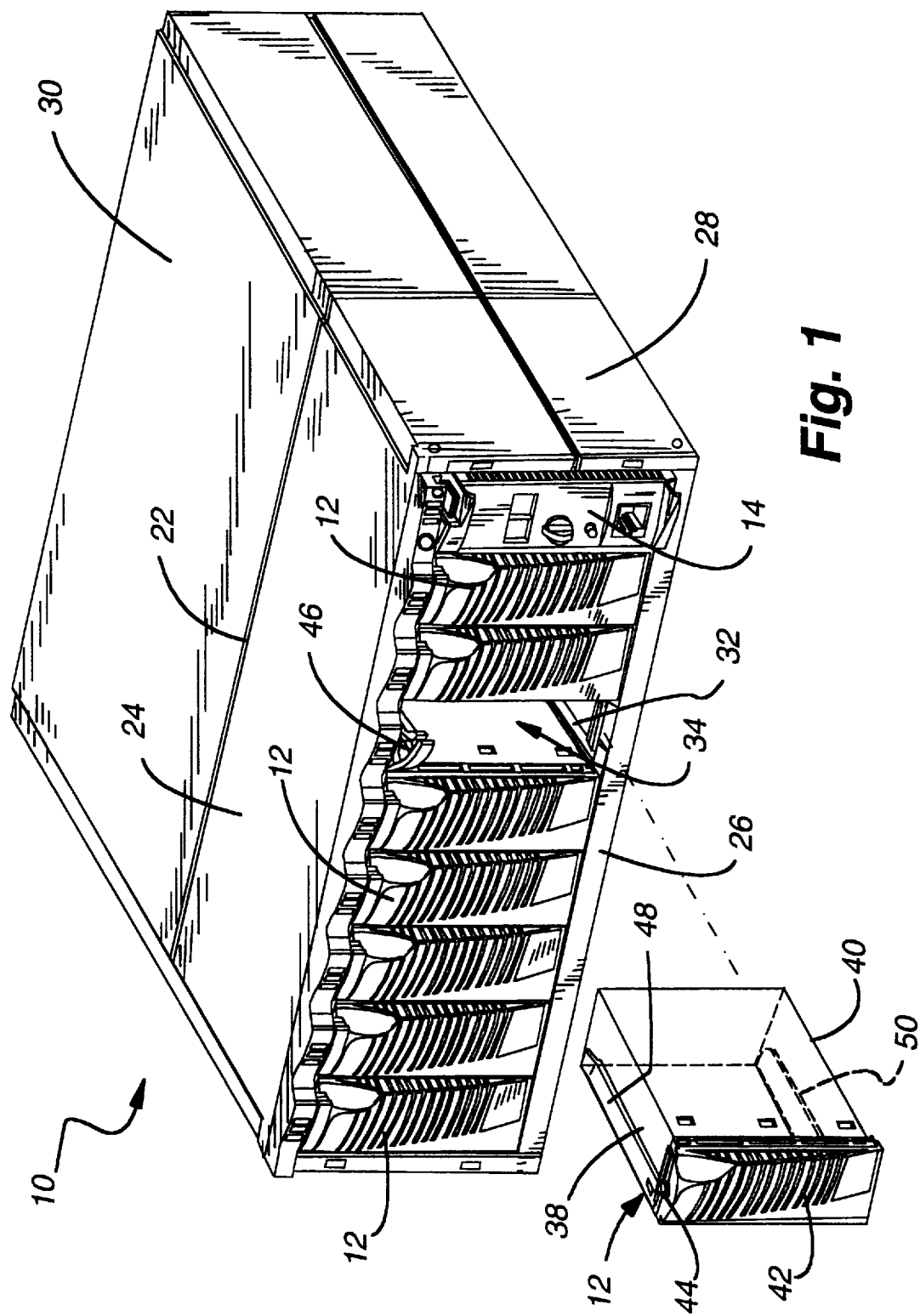
FIG. 1 is a perspective front view of a computer module shelf showing a module housing aligned for insertion in an empty bay in the shelf.

Referring now to the drawing, a front perspective view of a shelf frame 10 is shown in FIG. 1. The shelf frame 10 has a capacity of eight module housings 12 arranged side by side along with an environmental monitoring module 14 located on the right side of the row of module housings 12. Each of the module housings 12 in this embodiment contains a high performance hard disk drive module 16 which has a rear module connector 18 mating with a corresponding back plane connector 20 mounted on the back plane 22 of the shelf 10. However, it is to be understood that other components may be housed inside the module housing 12 such as removable media drives, etc.

The shelf frame 10, as best shown in FIG. 1, is basically a five sided box structure having a top 24, a bottom 26, and sides 28 joining with the back plane 22. The back plane 22 is fastened to a support housing 30 for associated power supply and electronics components associated with the modules 14 and 16.

The bottom 26 of the frame 10 has eight, parallel, spaced flat bottomed grooves 32 in its upper or inside surface extending from the front edge rearward to the back plane 22 and spaced apart to define eight module bays 34 for receiving the module housings 12. The top 24 of the shelf frame 10 similarly also has eight parallel, spaced, flat bottomed grooves 36 in its inside surface extending from the front edge to the back plane 22. The back plane 22 carries eight power/signal connectors 20, one for each of the bays 34.

Each of the module housings 12 is basically a rectangular box which has a top 38, a bottom 40 and a front face 42. Projecting upward from the top 38, adjacent the front face 42, is a latching guide pin 44. This guide pin 44 is preferably cylindrical in shape and is generally centrally located between the sides of the module housing 12. This pin 44 engages a latch body 46 rotatably mounted to the top of the shelf 10 as will be described in more detail below. The module housing 12 also has an elongated tongue 48 mounted on the top 38 which matingly engages one of the grooves 36 in the top 24 of the shelf frame 10. Similarly, the bottom 40 of the housing 12 has an elongated tongue 50 extending along the length of the bottom 40 which matingly engages the corresponding one of the grooves 32 in the bottom 26 of the frame 10 directly beneath the groove 36 in the top 24. These two tongues 48 and 50 and their mating grooves 36 and 32 respectively, cooperate to guide insertion of a module housing 12 linearly into its bay 34 in the shelf 10 with minimal side to side play so that the connectors 18 and 20 are smoothly and correctly aligned and finally mated when the module housing 12 is fully inserted into the bay 34. In so doing, each module housing 12 is prevented from side to side movement by the close tolerances of these mating tongues 48 and 50 and grooves 36 and 32.

Each bay 34 has a latch body 46 rotatably mounted to the top 24 at the front of the shelf 10. The latch body 46 engages the pin 44 on the module housing 12 to first, prevent full insertion of the module housing 12 in the bay 34, and thus prevent engagement of the connectors 18 and 20, and second, to provide a separate, cam assistance to remote, full insertion and initial removal of the module housing connector 18 from the back plane connector 20. Full insertion and initial removal of the module housing 12 from the back plane connector 20 cannot be performed by pushing on the module housing 12 or slamming it into the bay 34. This is the "anti-slam" feature. Full insertion may only be accomplished by moving (rotating) the latch body 46 about its pivot axis from an open position as shown by the right module in FIG. 2, to a closed position as is best shown in the plan view of the left module housing 12 in the shelf 10 in FIG. 2.

Figure 2:
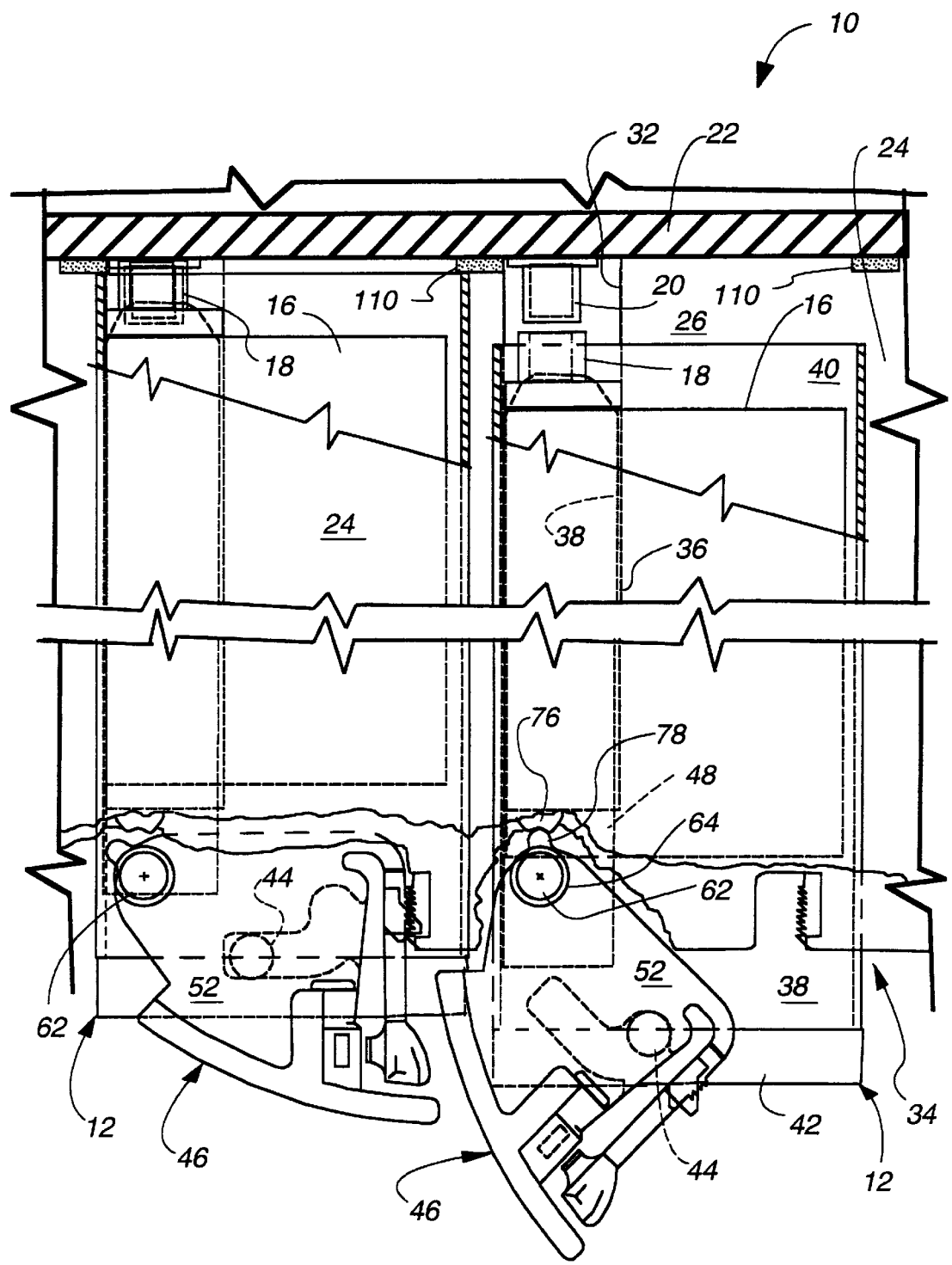
FIG. 2 is an enlarged partial top view of the shelf in FIG. 1 showing two modules side by side in adjacent bays, one module housing latched in place and one module housing being stopped from further insertion by the unlatched latch apparatus of the present invention.

Referring now specifically to FIG. 2, the module housing 12 on the right is shown in dashed lines being inserted into the bay 34 in the direction of the dashed arrow A. When the module housing 12 reaches the position shown in solid lines, further insertion is prevented by engagement of the pin 44 with the latch body 46. Forward movement of the module housing 12 is stopped at this point because of its latch guide pin 44 engaging the latch body 46. Further movement of the module housing 12 can only be in an arc about the pivot axis of the latch body 46. Such rotation is precluded by the engaged tongues and grooves above discussed. These tongues and grooves permit only linear movement of the module housing 12.

Figure 4:
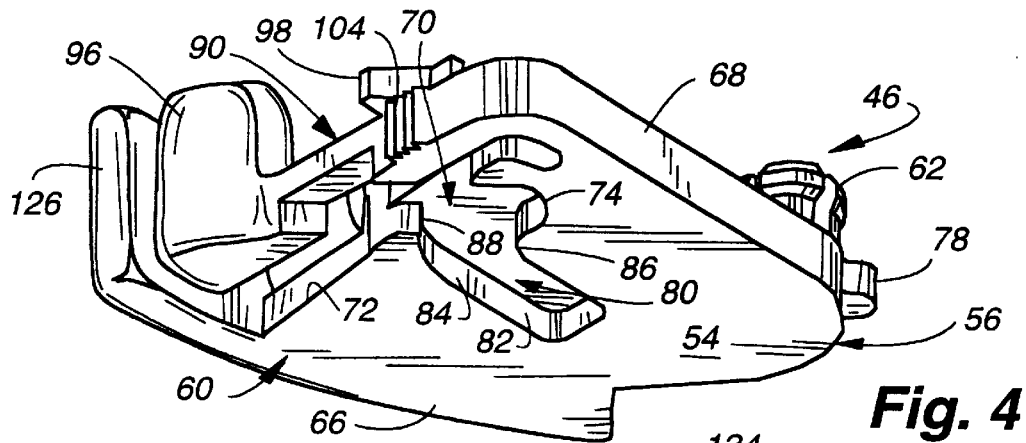
FIG. 4 is a separate, rear perspective view from below of the latch body in accordance with the invention.
Figure 5:
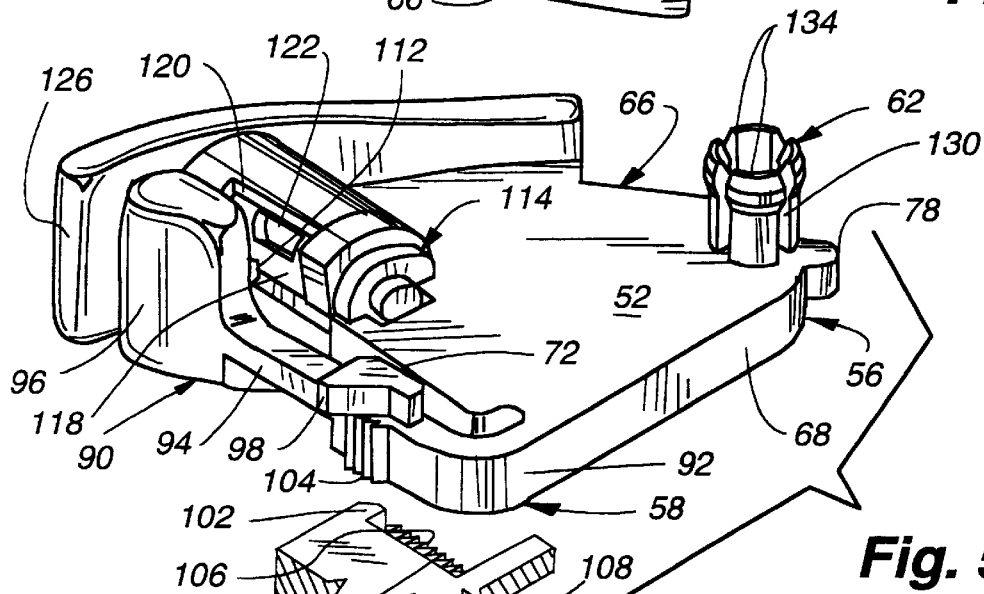
FIG. 5 is a rear perspective view from above of the latch body and part of the top of the frame showing the relationship between the latch teeth and the corresponding engaging recess in the shelf frame top in accordance with the invention.
Figure 6:
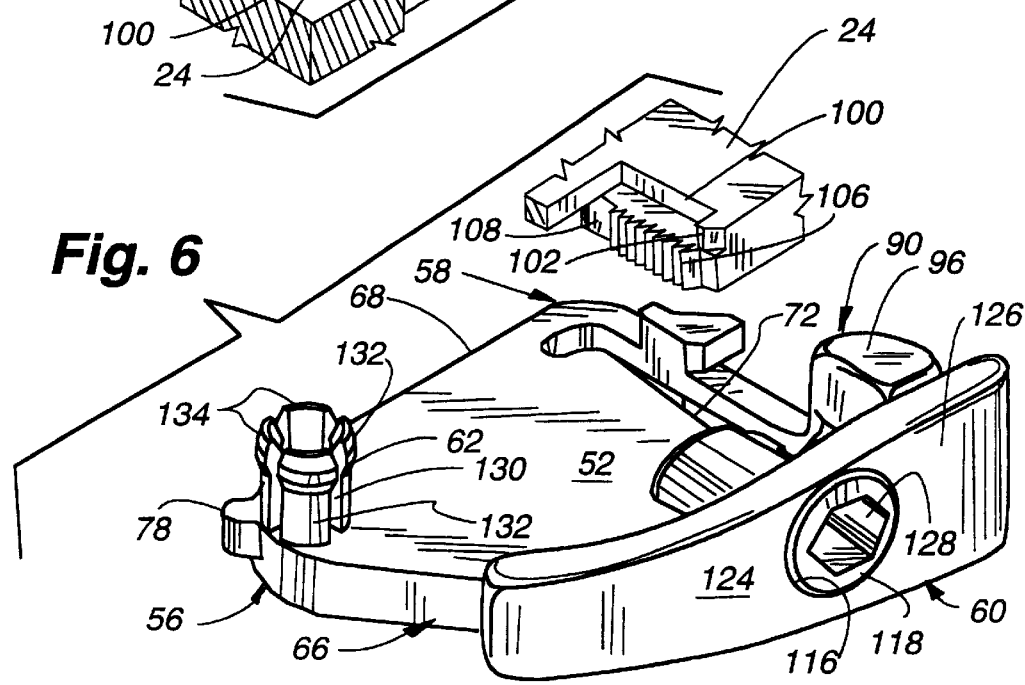
FIG. 6 is a front perspective view from above of the latch body and portion of the shelf frame shown in FIG. 5.

The latch body 46, shown separately in FIGS. 4 through 6, is a generally triangular shaped, somewhat flat body which has an upper surface 52, a lower surface 54, and first, second, and third corner portions 56, 58, and 60. The body 46 has a generally cylindrical support stem 62 projecting normal to the body 46 from one of the surfaces 52 or 54 at the first corner portion 56, depending on whether the latch apparatus is installed on the bottom 26 of the shelf 10 or the top 24 of the shelf 10. In the embodiment illustrated, the support stem 62 extends upward from the first corner portion 56 of the upper surface 52. This stem 62 rotatably fits within a correspondingly sized bore 64 in the top 24 of the shelf frame 10 so that the latch body 46 is free to pivot about the stem axis, in a plane parallel to the inside surface of the top 24, counterclockwise (as viewed from above) to a first or open position as shown by the right latch body 46 in FIG. 2, and clockwise (as viewed from above) to a second or closed position as shown by the left latch body 46 in FIG. 2.

The latch body 46 has a curved front edge 66 extending between the first corner portion 56 and the second corner portion 58, and a generally straight rear edge 68 extending between the first corner portion 56 and the third corner portion 60.

The lower surface 54 has a first channel 70 therein adapted to receive and engage the guide pin 44 when the latch body 46 is in the first or open position. The channel 70 is a straight channel which extends from the side latch edge 72 between the second and third corner portions 58 and 60 opposite the first corner portion 56. The channel 70 has a closed rear end 74 and opens through the side latch edge 72.

The closed end 74 of the channel 70 engages the guide pin 44 as above described to prevent further insertion of the module housing 12 past a predetermined intermediate position in the bay 34. This position is as shown by the right hand module housing 12 in FIG. 2, with the module connector 18 spaced just short of engagement with the back plane connector 20. Note that the front edge 66 of the latch body 46 does not have a channel. Therefore, the latch body 46, if in any other position than full open position, prevents module housing insertion even to the intermediate position by interference between the latch guide pin 44 against the front edge 66 of the latch body 46. The first channel 70 is positioned directly in line with the guide pin 44 only when the latch body is in the full open position. To this end, a depression or detent 76 is formed in the top 24 immediately adjacent the bore 64 to receive a projection or nub 78 projecting radially outward from the first corner portion 56 adjacent the stem 62 when the latch body 46 is in the full open position shown in the right hand bay assembly of FIG. 2. This projection 78 and detent 76 provide the operator with tactile feedback when the latch body snaps into the open position. This arrangement also prevents the latch body 46 from freely rotating out of the open position inadvertently, thus permitting the operator to insert a module housing 12 with one hand rather than requiring the operator to hold the latch 46 open and in alignment with the guide pin 44 with the other hand.

The latch body 46 has a second channel 80 in the lower surface 54 which has a blind straight end portion 82 which runs generally parallel with the rear edge 68 and a curved front portion 84 which intersects the first channel 70 forming a rounded protuberance 86 between the two channels and a cusp 88 opposite the rounded protuberance 86. This rounded protuberance 86 must be overcome if the module housing 12 is to be fully inserted into the bay 34. Pushing against the module housing 12 when it is in the intermediate position shown by the right hand module housing in FIG. 2 will not dislodge the guide pin 44 over the rounded protuberance 86. On the contrary, such an applied force will only more firmly lock the module housing in the intermediate position.

Figure 3:
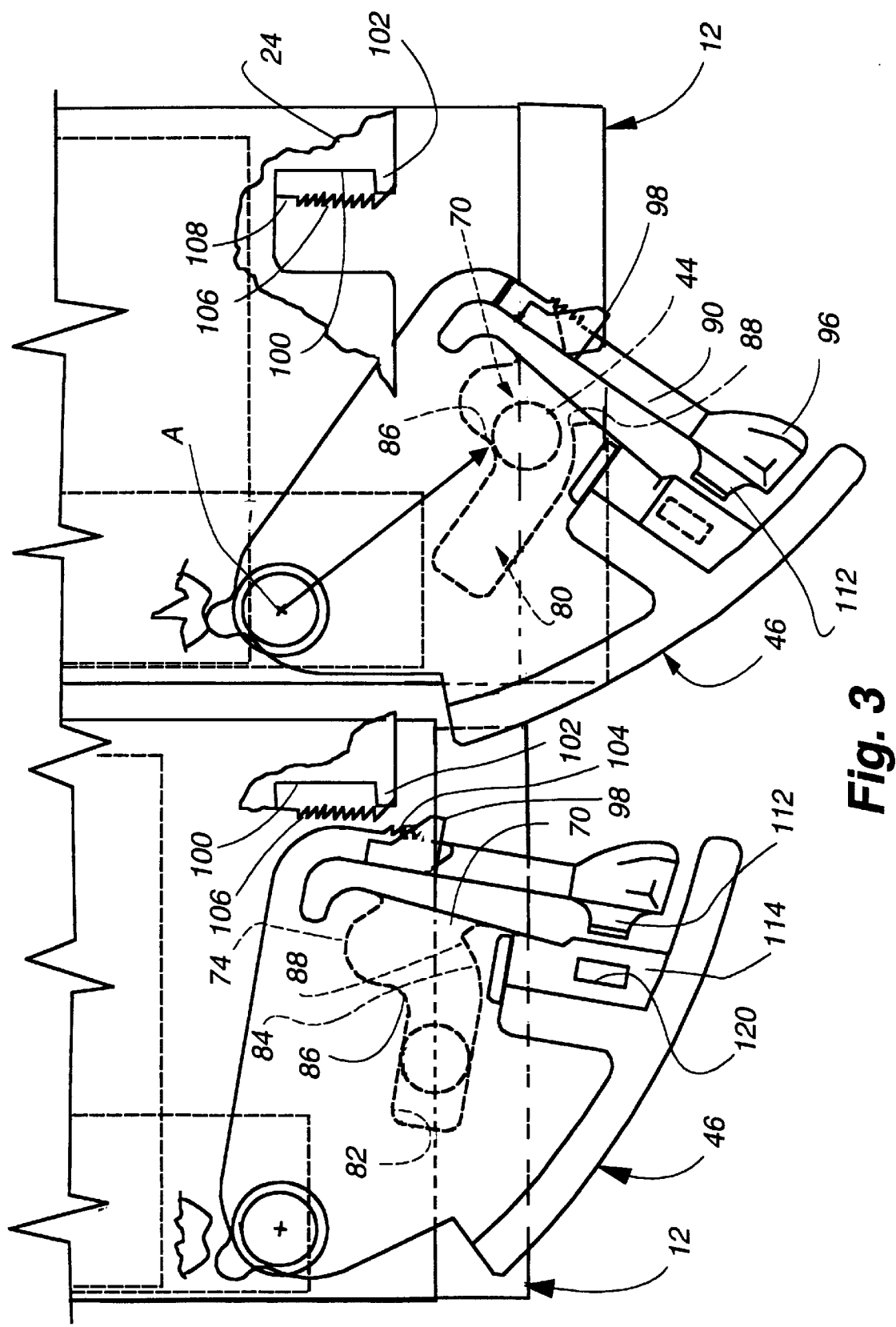
FIG. 3 is a schematic top view of two adjacent module housings in the shelf shown in FIG. 1 with the latch apparatus in different positions.

The module housing 12 may only be fully inserted in the bay 34 by rotating the latch body 46 from the first position as is shown in FIG. 3. FIG. 3 shows two module housings side by side, each in a slightly different position to illustrate the movement of the latch body 46 and the module housing 12 as the latch body 46 is rotated clockwise as viewed from above. This movement actually pushes the protuberance 86 against the guide pin 44 which backs the module housing 12 back out of the bay 34 slightly from the position of the right module housing 12 shown in FIG. 2, to dislodge the guide pin 44 from the closed end 74 of the first channel 70 and move the guide pin 44 over the rounded protuberance 86 and into the second channel 80 in the latch body 46.

The upper bay 34 in FIG. 3 illustrates the pin 44 being moved to the right, and hence the module housing 12 moving slightly back out of the bay 34, by the latch arm 46 being initially rotated a few degrees clockwise. Movement of the module housing 12 is caused by the rounded protuberance 86 pushing on the pin 44 as the latch body 46 is rotated clockwise causing a net outward force to be applied to the module housing 12.

After the guide pin 44 clears the rounded protuberance 86, and as the latch body 46 is rotated further, the cusp 88 formed between the sides of the intersecting channels 70 and 80 catches the guide pin 44 and pulls or levers the pin 44 through the curved portion 84 and into the blind straight end portion 82 of the second channel 80 as shown in the second bay 34 in FIG. 3. The latch body 46 then fully levers the module housing 12 into the bay 34 as is shown in the lower bay in FIG. 3 to fully mate the connectors 18 and 20 as shown in the left hand bay in FIG. 2. This levering action provides a significant mechanical advantage to the operator during final insertion of the module housing 12. This same mechanical advantage is provided also during initial removal of the module housing 12 from the bay 34, and hence disengagement of the mating connectors 18 and 20. This feature provides the operator with simple, one handed, even two finger, operation in both insertion and removal of the module housing 12.

The latch body 46 further includes an elongated latch arm 90 cantilever supported from the second corner portion 58. The latch arm 90 extends parallel to and spaced from the latch edge 72 between the second corner portion 58 and the third corner portion 60. The latch arm 90 has a curved base portion 92 joining the corner portion 58 and a straight arm portion 94 extending toward the front or third corner portion 60 which terminates in an enlarged gripping tab 96.

The upper side of the arm portion 94 has an outwardly projecting latch guard tooth 98 which enters a recess 100 in the top 24 as the latch arm approaches the second, or closed position shown in the left bay in FIG. 2. This guard tooth 98 engages a shoulder 102 in the front corner of the recess 100 to prevent removal of the module housing 12 unless the latch arm 90 is depressed, i.e., deflected toward the latch edge 72 of the latch body 46 to disengage the tooth 98 from the recess 10.

The guard tooth 98 is large and substantial. The module housing 12 cannot be removed without depressing the latch arm 90. However, the latch guard tooth 98 is not designed to latch the module housing into full insertion and engagement between the connectors 18 and 20. This function is performed by a series of small latch teeth 104 on the outer side of the latch arm 90 preferably directly beneath the guard tooth 98. These latch teeth 104 engage a complementary shaped series of ratchet teeth 106 on a side wall 108 of the top 24 directly beneath the recess 100.

The back plane 22 carries a rectangular ring 110 of electronic shield gasket material spaced around the connector 20. This ring 110 is partially compressed by the rear corners of the module housing 12 as it butts up against the rear of the bay 34. The latch teeth 104 engage the series of ratchet teeth 106 to hold the module housing 12 in engagement with this ring 110 and thus provide full shielding around the mated connectors 18 and 20. In addition, engagement between the latch teeth 104 and ratchet teeth 106 provides automatic adjustment for cumulative dimensional tolerances between different module housings 12 and bays 34 in the shelf frame 10.

The saw tooth shaped ratchet teeth 106 and the latch teeth 104 are preferably slightly undercut so that the force exerted on the module housing 12 by the resilient shield ring 110, or by someone trying to remove the module housing 12 without depressing the latch arm 90, tends to pull and thus further engage the latch and ratchet teeth together. This feature provides a fully adjustable positive latch of each module housing 12 in the shelf frame 10 so that there is no end play and hence potential unwanted vibration between the module housing and the shelf during module operation.

The tab 96 on the latch arm 90 is an enlarged bulbous tab shaped to comfortably receive a person's fingertip. The latch arm 90 has a preferably tapered lock pin 112 positioned behind the tab 96 projecting toward the latch edge 72 adjacent the third corner portion 60 of the latch body 46. This pin 112 is pressed toward the latch edge 72 when an operator touches and pulls against the tab 96 which resiliently deflects the latch arm 90 toward the latch edge 72.

The third corner portion 60 has a thickened lock boss 114 behind the front edge 66 and opposite the tab 96 on the latch arm 90. A blind bore 116 extends through the front edge 66 and into the lock boss 114 to accommodate a lock cylinder 118. The lock cylinder 118 is rotatably fastened in the bore 116. The lock boss 114 has an aperture 120 through its side into the bore 116. The lock cylinder 118 also has a recess 122 in its side adapted to receive the lock pin 112 therein when the lock cylinder 118 is rotationally aligned with the aperture 120. When so aligned and the tab 96 depressed, the lock pin 112 slips through the aperture 120 and into the aperture 122, permitting the latch arm 90 to deflect toward the latch side edge 72 sufficiently to allow the guard tooth 98 to clear the shoulder 102 on the top 24. The latch body 46 may then be rotated counterclockwise to lever against the pin 44, pulling the mating connectors 18 and 20 apart. When the latch body 46 is fully rotated to the open position, the guide pin 44 is aligned with the first channel 70. The operator may then simply slide the module housing 12 out of the bay 34.

The front edge 66 of the latch body 46 has an enlarged and tapered face portion 124 which terminates in a flat end tab 126 projecting from the third corner portion 60 over and in front of the tab 96 on the latch arm 90. This flat end tab 126 and the latch tab 96 are squeezed together to move the latch arm 90 toward the side edge 72 to unlatch the teeth 98 and 106 from the top 24. In addition, this tapered face portion 124 provides enhance structural support to the latch body 46 as well as a pleasing ergonomic appearance.

The lock cylinder 118 has a keyway 128 of arbitrary shape to receive a correspondingly shaped key (not shown). Although a hexagonal cylindrical shaped keyway is shown in the figures, any shape may be used. The object here is to prevent tampering with the module housing by unauthorized personnel. Thus the lock described makes the module housings tamper resistant. The lock cylinder 118 also preferably includes a pair of depressions (not shown) which mate with a small protuberance (not shown) in the bore 116 when the lock is rotated to each of the locked and the unlocked positions to provide tactile indication of these positions. A conventional key lock mechanism could also be accommodated in the latch body 46. However, a special shaped key way requiring a specially shaped key is preferred and believed to be adequate to achieve tamper resistance.

The support stem 62 preferably has a snap fit arrangement into the top 24. To this end, the stem 62 preferably is a round tubular member having three or four longitudinal slots 130 separating the stem into three or four equally spaced fingers 132. Each of the fingers 132 has an enlarged distal end 134 which may have a saw tooth or wedge cross sectional shape to resiliently snap into the bore 64 in the top 24 of the shelf frame 10.

The latch body is preferably a single, injection molded, plastic body which may be made of any suitable plastic material having the strength and rigidity necessary to perform its described functions. The preferred material is a polycarbonate acetyl butyl styrene (PC/ABS) blend plastic.

The illustrated embodiment of the latch apparatus of the invention has been shown and described with reference to one preferred embodiment thereof. Many alternatives, changes, and modifications may be made to the latch apparatus and will be readily apparent to those skilled in the art. For example, the latch body may be mounted on the bottom 26 or from the side of the shelf frame 10 rather than the top as shown. In this first alternative instance, the latch body would preferably be a substantial mirror image of the embodiment illustrated. The latch apparatus may also be used in other modular installations than computer related installations above described. For example, the apparatus may advantageously be used in military rack mounted electronic module installations or in consumer product installations such as automotive applications or stereo component mounting arrangements, etc.

The latch apparatus may also be used with module housings that span more than one bay 34. For example, the module housing 12 may be sized to accommodate a 5¼ inch hard disk drive module, which would take up three bays as shown in FIG. 1. In this case, only the middle latch body 46 would be used with a correspondingly placed guide pin 44 on the module housing.

A big advantage of the latch apparatus above described is that the module housing 12 can accommodate a module which requires front access for insertion and removal of removable media or other subcomponents such as memory modules, disks or tape cartridges. The latch apparatus above described completely clears the body of the module housing 12.

The shape of the latch body may also be other than as specifically described. For example, the latch body may have a different front facial shape or may be configured to engage a side mounted guide pin rather than a top or bottom mounted guide pin as described above. All such changes and alternatives and variations are intended to be within the scope of the invention as defined by the following claims. All patents, patent applications, and printed publications referred to herein are hereby incorporated by reference in their entirety.

What is claimed is:

1. An anti-slamming latch for removably installing a module housing into a bay in a frame having a predetermined width, said module housing having a guide pin on a front portion thereof projecting from said housing, said latch apparatus comprising:

a latch body supported from said frame allowing removal and insertion of a rear portion of said module housing into said bay, said latch body having a first channel therein adapted to receive and engage said guide pin in a first position, said first channel having a closed end engaging said guide pin to prevent insertion of said module housing past a predetermined intermediate position in said bay, said latch body having a second channel intersecting said first channel forming a rounded protuberance therebetween wherein said module housing may only be fully inserted in said bay by moving said latch body from said first position to dislodge said guide pin from said closed end and move said pin over said rounded protuberance and into said second channel in said latch body.

2. The latch apparatus according to claim 1 wherein said latch body has a second closed position wherein said guide pin is fully within said second channel in said latch body.

3. The latch apparatus according to claim 2 wherein said latch body further comprises an integral latch arm engaging a recess in said frame in said second position to retain said module housing in said bay.

4. The latch apparatus according to claim 3 wherein said latch arm has a guard tooth engaging said recess in said frame and a plurality of latch teeth engaging a plurality of complementary shaped small teeth on said frame.

5. The latch apparatus according to claim 3 wherein said latch arm is a cantilever supported beam extending from a corner portion of said latch body.

6. The latch apparatus according to claim 1 wherein said latch body has an upper surface, a lower surface, and first, second, and third corner portions, a support stem having a central axis projecting normal to said latch body from one of said surfaces at said first corner portion, said support stem being adapted to mate in a corresponding aperture in said frame so that said latch body can pivot about said central axis, a front edge of said latch body extending between said first corner portion and said second corner portion, and a rear edge extending between said first corner portion and said third corner portion.

7. The latch apparatus according to claim 6 wherein said latch body further comprises an integral latch arm extending from said third corner portion toward said second corner portion engaging a recess in said frame in said second position to retain said module housing in said bay.

8. The latch apparatus according to claim 7 wherein said latch arm has a guard tooth engaging said recess in said frame and a plurality of latch teeth engaging a plurality of complementary shaped ratchet teeth on said frame in said recess when said latch arm is in said second position.

9. The latch apparatus according to claim 8 wherein one end of said latch arm is cantilever supported from said third corner portion.

10. The latch apparatus according to claim 2 wherein said latch body is rotatably supported from said frame for rotation of said latch body between said first and second positions.

11. The latch apparatus according to claim 10 wherein said latch body further comprises an integral latch arm engaging a recess in said frame in said second position to retain said module housing in said bay.

12. The latch apparatus according to claim 11 wherein said latch arm has a guard large tooth engaging said recess in said frame and a plurality of latch teeth engaging a plurality of complementary shaped ratchet teeth on said frame in said second position.

13. The latch apparatus according to claim 11 wherein said latch arm is a cantilever supported beam extending from a corner portion of said latch body.

14. The latch apparatus according to claim 10 wherein said frame has a depression and said latch body has a corresponding protrusion engaging said depression to maintain said latch body in said first position aligning said first channel with said guide pin on said module housing during insertion of said rear portion of said module housing so that said guide pin engages said first channel as said module housing is inserted in said bay.

15. The latch apparatus according to claim 14 wherein said latch body has an upper surface, a lower surface, and first, second, and third corner portions, a support stem having a central axis projecting normal to said latch body from one of said surfaces at said first corner portion, said support stem being adapted to mate in a corresponding aperture in said frame so that said latch body can pivot about said central axis, a front edge of said latch body extending between said first corner portion and said second corner portion, and a rear edge extending between said first corner portion and said third corner portion.

16. The latch apparatus according to claim 15 wherein said latch body further comprises an integral latch arm extending from said third corner portion toward said second corner portion engaging a recess in said frame in said second position to retain said module housing in said bay.

17. The latch apparatus according to claim 16 wherein said latch arm has a guard tooth engaging said recess in said frame and a plurality of latch teeth engaging a plurality of complementary shaped ratchet teeth on said frame in said recess when said latch arm is in said second position.

18. The latch apparatus according to claim 17 wherein one end of said latch arm is cantilever supported from said third corner portion.

19. The latch apparatus according to claim 18 wherein said protrusion on said latch body mating with said depression in said frame is located on said first corner portion of said latch body adjacent to said support stem.

20. The latch apparatus according to claim 19 wherein said depression is formed adjacent said aperture in said frame receiving said support stem.

21. An anti-slamming latch apparatus for removably installing a module housing into a bay in a frame having a predetermined width, said module housing having a guide pin on a front portion thereof projecting from said housing, said latch apparatus comprising:
    a latch body supported from said frame allowing removal and insertion of a rear portion of said module housing into said bay, said latch body having a first channel therein adapted to receive and engage said guide pin in a first position, said first channel having a closed end engaging said guide pin to prevent insertion of said module housing past a predetermined intermediate position in said bay, said latch body having a second channel intersecting said first channel forming a rounded protuberance therebetween wherein said module housing may only be fully inserted in said bay by moving said latch body from said first position to dislodge said guide pin from said closed end and move said guide pin over said rounded protuberance and into said second channel in said latch body; and
    a lock mechanism in said latch body for maintaining said guide pin in said second channel in said latch body.

22. The latch apparatus according to claim 21 wherein said latch body has a second closed position wherein said guide pin is fully within said second channel in said latch body, said lock mechanism being operable in said second closed position.

23. The latch apparatus according to claim 22 wherein said latch body further comprises an integral latch arm engaging a recess in said frame in said second position to retain said module housing in said bay.

24. The latch apparatus according to claim 23 wherein said latch arm has a guard tooth engaging said recess in said frame and a plurality of latch teeth engaging a plurality of complementary shaped ratchet teeth on said frame.

25. The latch apparatus according to claim 23 wherein said latch arm is a cantilever supported beam extending from a corner portion of said body.

26. The latch apparatus according to claim 21 wherein said latch body has an upper surface, a lower surface, and first, second, and third corner portions, a support stem having a central axis projecting normal to said latch body from one of said surfaces at said first corner portion, said support stem being adapted to mate in a corresponding aperture in said frame so that said latch body can pivot about said central axis, a front edge of said latch body extending between said first corner portion and said second corner portion, and a rear edge extending between said first corner portion and said third corner portion.

27. The latch apparatus according to claim 26 wherein said latch body further comprises an integral latch arm extending from said third corner portion toward said second corner portion engaging a recess in said frame in said second position to retain said module housing in said bay.

28. The latch apparatus according to claim 27 wherein said latch arm has a guide tooth engaging said recess in said frame and a plurality of latch teeth engaging a plurality of complementary shaped ratchet teeth on said frame in said recess when said latch arm is in said second position.

29. The latch apparatus according to claim 28 wherein one end of said latch arm is cantilever supported from said third corner portion.

30. The latch apparatus according to claim 22 wherein said latch body is rotatably supported from said frame for rotation of said latch body between said first and second positions.

31. The latch apparatus according to claim 23 wherein said lock mechanism comprises a rotatable lock cylinder in said latch body and a lock pin extending from said latch arm toward said lock cylinder in said latch body, said lock cylinder further having a cavity in an outer surface thereof shaped corresponding to said lock pin, said cavity facing said lock pin at only one rotational position of said lock cylinder so that said latch arm may be depressed to release said latch arm from said recess in said frame only when said lock cylinder cavity faces the lock pin.

32. The latch apparatus according to claim 31 wherein said lock cylinder further comprises a keyway of predetermined shape for receiving a key to turn said lock cylinder in said latch body.

33. An anti-slamming latch apparatus for installing a module housing into a bay in a frame having a predetermined width, said frame supporting a top guide member in said bay and a bottom guide member spaced from and extending generally parallel to the top guide member in said bay for maintaining said module housing aligned within said predetermined width of said bay, said module housing having a stop pin projecting therefrom, said latch apparatus comprising:
    a latch body having an upper surface, a lower surface, and first, second, and third corner portions, a support stem having a central axis projecting normal to said latch body from one of said surfaces at said first corner portion, said support stem being adapted to mate in a corresponding aperture in said frame so that said latch body can pivot about said central axis, a front edge of said latch body extending between said first corner portion and said second corner portion, a rear edge extending between said first corner portion and said third corner portion, a cantilever supported latch arm spaced from and extending along a side edge of said latch body opposite said first corner portion between said second and third corner portions, said latch arm extending outward from said third corner portion of said latch body and extending toward said second corner portion, said latch arm being resiliently biased away from said side edge of said latch body, and a pair of intersecting channels in the other one of said surfaces engagable with said stop pin, a first of said pair of channels opening through said front edge of said body and joining a second of said pair of channels at a rear end thereof, the second channel having a "J" shape with a straight portion extending generally parallel to said rear edge and a curved portion merging into said rear end of said first channel, said curved portion forming a rounded protuberance between said straight portion and said first channel, wherein said module housing, in order to be inserted into said bay, must engage said stop pin in said first channel and insertion of said module is stopped at an intermediate position in said bay when said stop pin reaches said rear end of said first channel, said latch apparatus preventing further insertion of said module housing in said bay until said latch body is rotated about said axis to move said stop pin over said rounded protuberance into said straight portion of said second channel.

34. A module housing for use in a shelf frame adapted to carry a plurality of module housings, said shelf frame supporting an anti-slamming latch thereon to prevent slamming a module housing into a back plane carrying an electrical connector for mating with a complementary connector on a module carried in the module housing, said module housing comprising at least a five sided box including a front panel fastened to a top panel and a bottom panel, said top panel having a guide member mounted thereon for guiding insertion of said housing in said shelf frame, and a guide pin projecting from said top for engaging with said anti-slamming latch, said guide member and said guide pin cooperating to prevent complete insertion of said housing when said pin engages said latch.

* * * * *